(12) United States Patent
Tokushige

(10) Patent No.: US 6,908,834 B2
(45) Date of Patent: Jun. 21, 2005

(54) SEMICONDUCTOR DEVICE PRODUCTION METHOD AND SEMICONDUCTOR DEVICE

(75) Inventor: Nobuaki Tokushige, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 22 days.

(21) Appl. No.: 10/635,645

(22) Filed: Aug. 7, 2003

(65) Prior Publication Data

US 2004/0029317 A1 Feb. 12, 2004

(30) Foreign Application Priority Data

Aug. 7, 2002 (JP) ........................... 2002-230056

(51) Int. Cl.⁷ ................... H01L 21/20; H01L 29/06
(52) U.S. Cl. ......................... 438/479; 257/623
(58) Field of Search .......................... 438/106, 118, 438/121–127, 455, 457, 458, 478, 479, 482, 483, 486; 257/618, 619, 623

(56) References Cited

U.S. PATENT DOCUMENTS

| | | |
|---|---|---|
| 4,727,047 A | 2/1988 | Bozler et al. |
| 5,702,963 A | 12/1997 | Vu et al. |
| 5,821,138 A * | 10/1998 | Yamazaki et al. .......... 438/166 |
| 6,156,627 A | 12/2000 | Zhang et al. |
| 6,326,280 B1 | 12/2001 | Tayanaka |
| 2001/0039103 A1 | 11/2001 | Muramatsu et al. |

FOREIGN PATENT DOCUMENTS

| | | |
|---|---|---|
| EP | 0 858 110 A1 | 8/1998 |
| EP | 0 924 769 A1 | 6/1999 |
| JP | 11-251600 A | 9/1999 |
| JP | 2001-331120 A | 11/2001 |

OTHER PUBLICATIONS

European Search Report dated Aug. 26, 2004.

* cited by examiner

*Primary Examiner*—Evan Pert
(74) *Attorney, Agent, or Firm*—Nixon & Vanderhye P.C.

(57) ABSTRACT

A semiconductor device production method is provided, which comprises the steps of: (a) forming an insulative film on an underlying substrate; (b) forming a semiconductor layer on the insulative film; (c) bonding a flexible substrate onto the semiconductor layer; and (d) separating the semiconductor layer on the flexible substrate from the insulative film on the underlying substrate.

15 Claims, 9 Drawing Sheets

SEMICONDUCTOR DEVICE PRODUCTION METHOD AND SEMICONDUCTOR DEVICE

CROSS-REFERENCE TO RELATED APPLICATION

This application is related to Japanese application No. 2002-230056 filed on Aug. 7, 2002, whose priority is claimed under 35 USC § 119, the disclosure of which is incorporated by reference in its entirety.

BACKGROUND OF THE INVENTION

1. Field of the Invention

The present invention relates to a flexible semiconductor device and a production method therefor. More specifically, the invention relates to a semiconductor device including a semiconductor substrate usable in a bent state. The inventive flexible semiconductor device is applicable, for example, to a driver for a liquid crystal display device.

2. Description of the Related Art

There is an increasing trend toward the size reduction and portability facilitation of electronic devices such as mobile phones. As a result of the ultimate facilitation of the portability, a wearable computer or "wearable PC" has recently been disclosed, which is a combination of a garment and a computer mounted thereon. In order to realize the wearable computer, the semiconductor device is required to have flexibility so as to be used in a bent state for system package solution.

One approach to the realization of the flexible semiconductor device is to employ a thin film chip formation method for a solar cell as disclosed in U.S. Pat. No. 4,727,047. FIGS. 9(a) to 9(f) are diagrams for explaining the solar cell thin film chip formation method.

As shown in FIG. 9(a), a substrate 31 is first prepared as an underlying substrate. The substrate 31 is composed of GaAs, for example, and crystalline GaAs is caused to grow on a surface of the substrate 31 as will be described later. Then, a photolithography process is performed by resist application, exposure and development, and a heat treatment process is performed at 400° C. for about one minute. Through these processes, a mask layer 33 for the crystal growth is selectively formed on the substrate 31 as shown in FIG. 9(b), whereby recesses 35 are formed to expose surface portions of the substrate 31.

In turn, crystalline GaAs is caused to grow on the resulting substrate in an $AsCl_3$—Ga—$H_2$ vapor atmosphere as shown in FIG. 9(c). The crystalline GaAs grows first on the surface portions of the substrate 31 in the recesses 35, then on side faces of the mask layer 33, and horizontally along an upper surface of the mask 33. Thus, grown GaAs layers 36a are formed in the recesses 35, and a crystalline GaAs layer 36 is formed on the grown GaAs layers 36a and the mask layer 33 as shown in FIG. 9(d). Thereafter, an element is formed in the crystalline GaAs layer 36.

Then, the crystalline GaAs layer 36 is separated from the substrate 31 by cleaving the mask layer 33 or by etching away the mask layer 33 with hydrofluoric acid (FIG. 9(e)). Thus, a flexible semiconductor chip 36b is produced as shown in FIG. 9(f).

Further, one approach to the realization of a flexible liquid crystal display is to employ a thin film Si chip formation method for an active matrix liquid crystal display (AMLCD) as disclosed in U.S. Pat. No. 5,702,963.

In this method, the production of the flexible semiconductor device is achieved by employing a silicon-on-insulator (SOI) substrate and a lift-off method. More specifically, the SOI substrate is prepared by forming in this order an Si substrate surface layer, an Si buffer layer for protecting the Si substrate surface layer during lift-off, an underlying oxide layer, a release layer (e.g., an oxide/nitride layer to be separated) having a lower etching rate than the underlying oxide layer, and an upper Si layer in which an element is formed.

Thereafter, a TFT transistor element is formed in the upper Si layer by a known method. Then, the underlying oxide layer present between the release layer and the Si buffer layer is partly removed, and support posts for temporarily supporting the layers present above the release layer are formed in regions devoid of the underlying oxide layer. In this state, the underlying oxide layer is etched away for formation of a cavity. In turn, the upper Si layer formed with the element is sealed with a resin. Finally, the resulting element/substrate is separated by cleaving the support posts. Thus, a flexible chip is produced.

However, the underlying substrate 31 employed in the first prior art (U.S. Pat. No. 4,727,047) is reusable after the process. The surface of the underlying substrate influences the initial stage of the growth of the GaAs layers 36a. Since the grown layers 36a are formed directly on the underlying substrate, the growth of the GaAs layers 36a is likely to be influenced by the morphology and contamination of the surface of the underlying substrate. Therefore, uniform growth of the layers is difficult, so that uneven films may be formed. The formation of the uneven films results in local concentration of stresses in the grown GaAs layers 36a and the crystalline GaAs layer 36. Therefore, the grown GaAs layers 36a and the crystalline GaAs layer 36 are poorer in flexibility and susceptible to cracking.

In the second prior art (U.S. Pat. No. 5,702,963), the upper Si layer (element formation layer) is formed directly on the release layer. In this case, there is a possibility that the upper Si layer is separated during the formation of the element due to poor adhesion between the upper Si layer and the release layer (the adhesion depends on the morphology of the underlying release layer). Further, the semiconductor layer has a relatively uneven thickness and, hence, a poorer flexibility.

SUMMARY OF THE INVENTION

It is therefore an object of the present invention to provide a semiconductor device production method for producing a flexible semiconductor device without any influence of an underlying substrate. It is another object of the present invention to provide a high quality semiconductor device produced by such a method.

According to a first aspect of the present invention to solve the aforesaid problems, there is provided a semiconductor device production method, which comprises the steps of: (a) forming an insulative film on an underlying substrate; (b) forming a semiconductor layer on the insulative film; (c) bonding a flexible substrate onto the semiconductor layer; and (d) separating the semiconductor layer on the flexible substrate from the insulative film on the underlying substrate.

With this arrangement, the insulative film and the semiconductor layer are formed in this order on the underlying substrate, and then the flexible substrate is bonded onto the semiconductor layer. After the bonding of the flexible substrate onto the semiconductor layer, the semiconductor layer on the flexible substrate is separated from the insulative film on the underlying substrate. Thus, the flexible semiconductor device can be produced which includes the flexible substrate and the semiconductor layer formed without any influence of the underlying substrate.

According to another aspect of the present invention, there is provided a semiconductor device production method, which comprises the steps of: (e) forming an insulative film on an underlying substrate and patterning the insulative film to form a recess in the insulative film; (f) forming a semiconductor layer on the insulative film, the semiconductor layer having a thick film portion located on a portion of the insulative film formed with the recess and a thin film portion located on a portion of the insulative film adjacent to the recess; (g) separating the semiconductor layer on the flexible substrate from the insulative film on the underlying substrate; and (h) bonding a flexible substrate onto a surface of the separated semiconductor layer which has been opposed to the underlying substrate.

According to this inventive aspect, the semiconductor layer has the thick film portion and the thin film portion provided in adjacent relation, so that the thin film portion imparts flexibility to the semiconductor layer. Further, the semiconductor layer is formed on the insulative film and, after the insulative film is removed, the flexible substrate is bonded onto the semiconductor layer. Therefore, the semiconductor layer can be formed as having a high quality without direct contact with the underlying substrate. Since the flexible substrate is bonded onto the semiconductor layer having the thick film portion and the thin film portion, the semiconductor device including the semiconductor layer and the flexible substrate has a flexible and robust structure as a whole. Further, the semiconductor layer has the thick film portion, so that a high breakdown voltage element can be formed.

DETAILED DESCRIPTION OF THE INVENTION

Figure 1A:
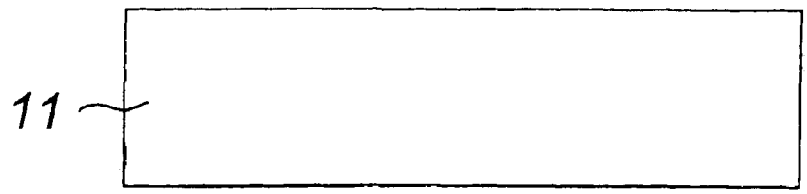
FIGS. 1(a) to 1(e) are diagrams for explaining production steps of a semiconductor device production method according to a first embodiment of the present invention.
Figure 1B:
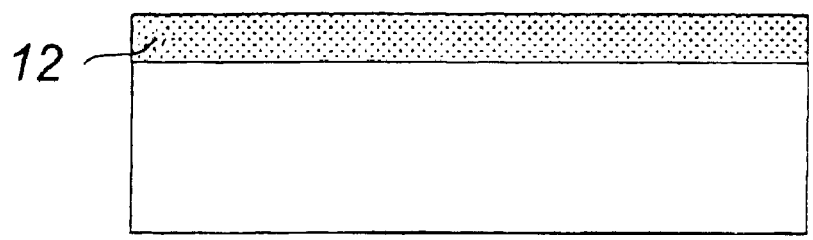

A first semiconductor device production method according to the present invention comprises the steps of: (a) forming an insulative film on an underlying substrate; (b) forming a semiconductor layer on the insulative film; (c) bonding a flexible substrate onto the semiconductor layer; and (d) separating the semiconductor layer on the flexible substrate from the insulative film on the underlying substrate.

In the step (a) in which the insulative film is formed on the underlying substrate, exemplary substrates usable as the underlying substrate include elemental semiconductor substrates such as of Si and Ge, compound semiconductor substrates such as of GaAs and InGaAs and glass substrates. In general, a monocrystalline Si substrate and a polycrystalline Si substrate are preferred.

Preferred examples of the insulative film include an Si oxide film, an Si nitride film and an SiON film, but the insulative film is not limited thereto. Any other material which can easily be cleaved or etched away in the later step may be employed for the insulative film.

In the step (b) in which the semiconductor layer is formed, exemplary materials for the semiconductor layer include elemental semiconductors such as Si and Ge, compound semiconductors such as GaAs, InP, ZnSe and CsS, among which Si is particularly preferred. The semiconductor layer may have a plurality of layers. And each layer may be formed of the material as described above. The semiconductor layer preferably has a thickness of 25 $\mu$m to 100 $\mu$m, more preferably 25 $\mu$m to 50 $\mu$m so as to exhibit flexibility when an external force is applied thereto.

After the formation of the semiconductor layer, a semiconductor element may be formed in the semiconductor layer. The semiconductor element thus formed has flexibility. The type of the semiconductor element is not particularly limited, but examples of the semiconductor element include MOS transistors and memory elements. Further, a circuit may be formed in the semiconductor layer by forming a plurality of elements.

Where Si is employed as the material for the semiconductor layer, the semiconductor layer may be a crystalline Si layer. Particularly, an a-Si film may be formed and crystallized into the crystalline Si layer by a catalytic method. That is, the formation of the crystalline semiconductor layer can easily be achieved by forming a catalytic layer on the a-Si film and crystallizing the a-Si layer into the crystalline Si layer through a catalytic reaction. In this case, preferred examples of a material for the catalytic layer include metals such as nickel, iron, cobalt and platinum, and hybrid materials containing at least one of these elements. Further, suicides such as nickel silicide may be employed as the catalytic material instead of an elemental metal such as nickel.

Where the catalytic method is employed for the crystallization and a multiplicity of elements are simultaneously formed on the substrate, the a-Si film may be patterned for isolation of the elements after the formation of the a-Si film, and then crystallized. Thus, the elements can be isolated on a per-element basis at the early stage of the element formation step. This obviates a final dicing step.

Where the crystallization is achieved by the catalytic method, the catalytic layer may preliminarily be patterned. The preliminary patterning of the catalytic layer makes it possible to grow the crystalline Si layer laterally. The laterally grown film has a film structure closer to a monocrystalline structure (with a greater grain size) than a vertically grown film. Therefore, elements each having a higher film quality can be formed in the subsequent element formation step.

In the step (c) in which the flexible substrate is bonded onto the semiconductor layer, a flexible resin may be used as a material for the flexible substrate. Exemplary resin materials include polyimide resin films and polyester resin films. Besides the resin materials, a stainless film may be employed as the flexible substrate. An adhesive may be employed for bonding the flexible substrate onto the semiconductor layer. Where a resin material having an adhesive property is employed, a flexible substrate composed of the adhesive resin material may be bonded directly onto the semiconductor layer.

In the step (d) in which the semiconductor layer on the flexible substrate is separated from the insulative film on the underlying substrate, the separation may be achieved by cleaving the insulative film or by etching away the insulative film. Where the separation is achieved by the etching, the flexible substrate is required to have a chemical resistance to an etchant such as hydrofluoric acid. Therefore, a stainless film or a resin material as described above is employed as the flexible substrate.

A second semiconductor device production method according to an example of the present invention comprises the steps of: (e) forming an insulative film on an underlying substrate and patterning the insulative film to form a recess in the insulative film; (f) forming a semiconductor layer on the insulative film, the semiconductor layer having a thick film portion located on a portion of the insulative film formed with the recess and a thin film portion located on a portion of the insulative film adjacent to the recess; (g) separating the semiconductor layer on the flexible substrate from the insulative film on the underlying substrate; and (h) bonding a flexible substrate onto a surface of the separated semiconductor layer which has been opposed to the underlying substrate.

In the step (e) in which the insulative film is formed on the underlying substrate and patterned for the formation of the recess in the insulative film, exemplary substrates usable as the underlying substrate include elemental semiconductor substrates such as of Si and Ge, compound semiconductor substrates such as of GaAs and InGaAs and glass substrates. In general, a monocrystalline Si substrate and a polycrystalline Si substrate are preferred.

An Si oxide film is preferably employed as the insulative film, but the insulative film is not limited thereto. Other examples of the insulative film include an Si nitride film and an SiON film. However, the insulative film is required to be formed of a material which can be patterned by the photolithography technique.

The formation of the recess aims at forming the thick film portion by embedding a semiconductor material in the recess in the subsequent step. That is, the depth of the recess provides a level difference between the thin film portion and the thick film portion. Therefore, the level difference between the thick film portion and the thin film portion is controlled by controlling the depth of the recess.

The recess may be configured so as to impart flexibility to the thin film portion adjacent to the thick film portion formed by the recess. For example, the recess may be configured so that linear thick film portions are provided in a parallel relation on opposite sides of a linear thin film portion. Alternatively, the recess may be configured so that a thick film portion is provided in a grid pattern on a planar thin film portion and surrounded by the thin film portion.

In order to impart flexibility to the semiconductor device, it is necessary to provide at least one thin film portion in the vicinity of the thick film portion. However, plural thick film portions and plural thin film portions may alternately be arranged in adjacent relation, so that the plural thin film portions impart flexibility to the semiconductor device.

In the step (f) in which the semiconductor layer having the thick film portion located on the portion of the insulative film formed with the recess and the thin film portion located on the portion of the insulative film adjacent to the recess is formed on the insulative film, the thin film portion of the semiconductor layer has a thickness of 25 $\mu$m to 100 $\mu$m, more preferably 25 $\mu$m to 50 $\mu$m, so as to exhibit flexibility when an external force is applied thereto. Since the thin film portion has flexibility, the thickness of the thick film portion is not particularly limited from the viewpoint of the flexibility. In consideration of a thickness balance between the thin film portion and the thick film portion, the thick film portion preferably has a thickness of 100 $\mu$m to 300 $\mu$m (e.g., about 100 $\mu$m).

Any semiconductor material may be employed for the formation of the semiconductor layer, as long as the thick film portion and the thin film portion can be formed in adjacent relation. Exemplary materials for the semiconductor layer include elemental semiconductors such as Si and Ge, compound semiconductors such as GaAs, InP, ZnSe and CsS, among which Si is particularly preferred.

Where crystalline Si is employed as the material for the semiconductor layer, the thick film portion and the thin film portion may be formed by a catalytic method. That is, the semiconductor layer formed in the step (f) may be a crystalline Si layer, and the step (f) comprises the steps of:
(f1) forming an a-Si layer on the insulative film;
(f2) forming a catalytic layer on the a-Si layer;
(f3) patterning the catalytic layer so as to leave a portion of the catalytic layer on the a-Si layer in the recess;
(f4) crystallizing the a-Si layer in contact with the catalytic layer into the crystalline Si layer through a catalytic reaction; and
(f5) removing the catalytic layer.

With this arrangement, the a-Si film is formed over the insulative film including the recess. Further, the catalytic layer is formed in the recess, and the a-Si film is crystallized through the reaction of the a-Si film in the presence of the catalytic layer. Thus, the crystalline Si layer is provided, which has the thick film portion formed in the recess and the thin film portion formed on the insulative film outside the recess. Then, the catalytic layer is removed. As a result, the flexible crystalline Si semiconductor layer can be formed without any influence of the surface of the underlying substrate.

Preferred examples of a material for the catalytic layer include metals such as nickel, iron, cobalt and platinum, and hybrid materials containing at least one of these elements. Further, silicides such as nickel silicide may be employed as the catalytic material instead of an elemental metal such as nickel.

After the formation of the semiconductor layer in the step a semiconductor element may be formed in at least one of the thick film portion and the thin film portion. The semiconductor element thus formed has flexibility. The type of the semiconductor element is not particularly limited, but examples of the semiconductor element include MOS transistors and memory elements. Further, a circuit may be formed in the semiconductor layer by forming a plurality of elements.

Since the thin film portion does not necessarily have a high breakdown voltage, a high breakdown voltage element should be formed in the thick film portion. Where a circuit such as a liquid crystal driver circuit including a high breakdown voltage element is to be formed, element layout in the semiconductor substrate is preferably determined so that elements for a logic circuit including no high breakdown voltage element is present in the thin film portion and elements for a driver circuit including a high breakdown voltage element such as a TFT transistor is present in the thick film portion. Thus, a flexible and compact semiconductor device can be provided.

In the step (g) in which the semiconductor layer on the flexible substrate is separated from the insulative film on the underlying substrate, the separation may be achieved by cleaving the insulative film or by etching away the insulative film. Where the separation is achieved by the etching, an etchant is selected according to the type of the insulative film. Where the Si oxide film is employed as the insulative film, a hydrofluoric acid solution mixture is employed as the etchant. For supporting the semiconductor substrate during the etching, a second support substrate may temporarily be bonded onto a surface of the semiconductor layer. The second support substrate should have a resistance to the etchant, and a preferred example thereof is a stainless film.

In the step (h) in which the flexible substrate is bonded onto the surface of the separated semiconductor layer which has been opposed to the underlying substrate, a flexible substrate bondable to the thick film portion and the thin film portion is employed. Examples of the flexible substrate include polyimide resin films and polyester resin films. These resin films are advantageous because they can be bonded directly to the semiconductor layer having undulations without the use of an adhesive. Where a flexible substrate having no adhesive property is employed, an adhesive may be employed for bonding the flexible substrate to the semiconductor layer.

Embodiments of the present invention will hereinafter be described with reference to the attached drawings.

First Embodiment

FIGS. 1(a) to 1(e) and 2(f) to 2(i) are diagrams for explaining production steps of a semiconductor device production method according to a first embodiment of the present invention.

A monocrystalline Si substrate is employed as an underlying substrate 11 for the production of a semiconductor device. First, a p-type Si underlying substrate 11 having an impurity concentration of about $5 \times 10^{15}$ cm$^{-3}$ is prepared (a so-called epitaxial substrate having a p-type or n-type epitaxial Si layer grown to a thickness of about 1 $\mu$m on an n-type Si substrate or a p-type Si substrate, or a glass substrate may be prepared) (FIG. 1(a)). An underlying Si oxide (SiO$_2$) film 12 having a thickness of 2000 Å is formed as an insulative film on the underlying substrate 11 by a plasma CVD method (FIG. 1(b)).

Figure 1C:
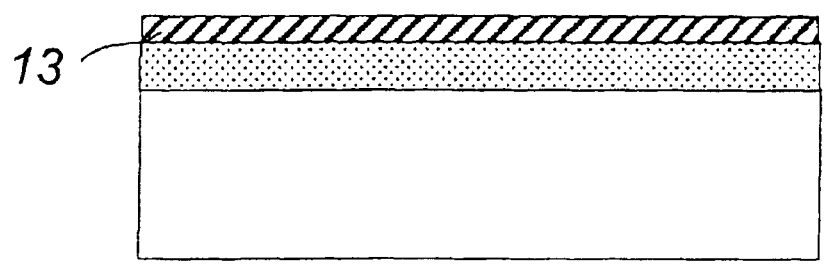

In turn, an a-Si film 13 having a thickness of 500 to 3000 Å (e.g., 1500 Å) is formed on the Si oxide film 12 by a plasma CVD method, and heated at 430° C. in a nitrogen atmosphere for 0.1 to 2 hours (e.g., 0.5 hour) for removing a trace amount of hydrogen from the a-Si film 13 (hydrogen removal) (FIG. 1(c)).

Figure 1D:
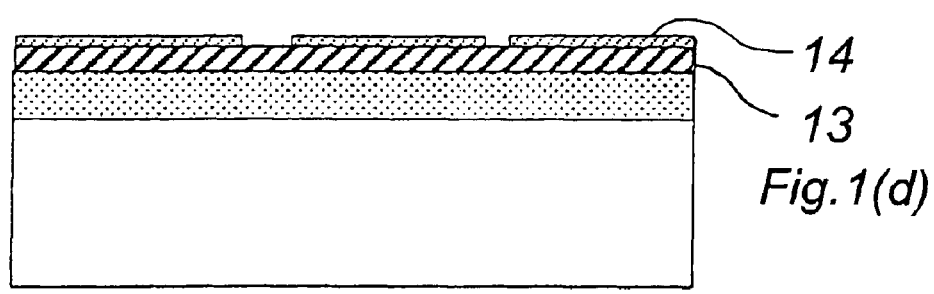
Figure 1E:
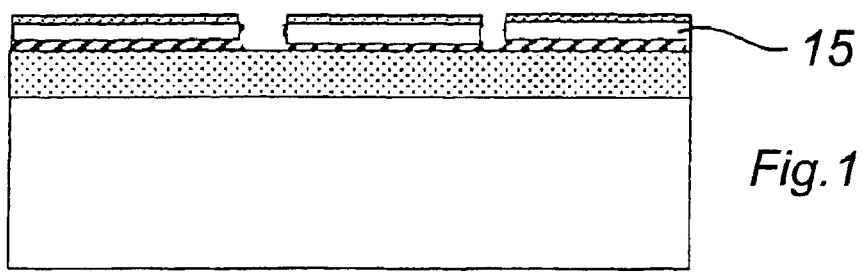
Figure 2F:
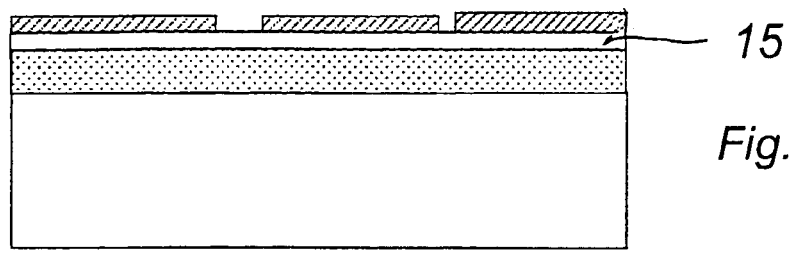
FIGS. 2(f) to 2(i) are diagrams for explaining production steps of the semiconductor device production method according to the first embodiment.
Figure 2G:
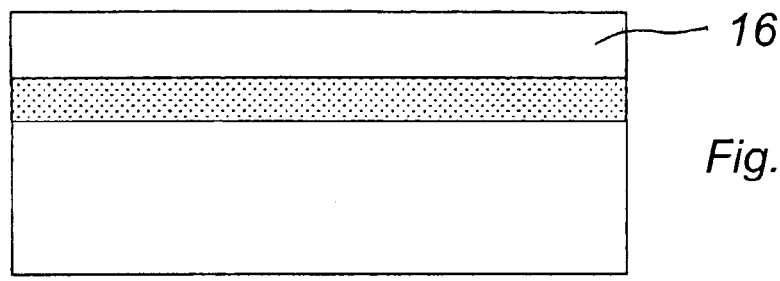
Figure 2H:
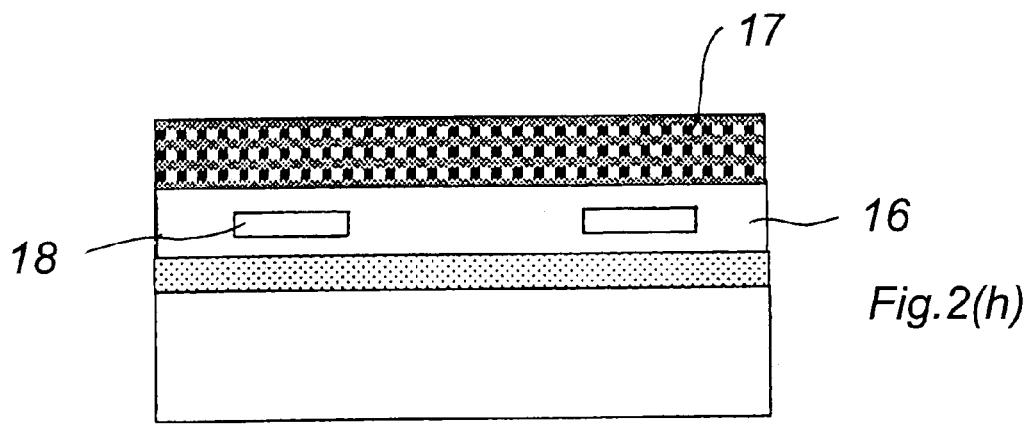
Figure 2I:
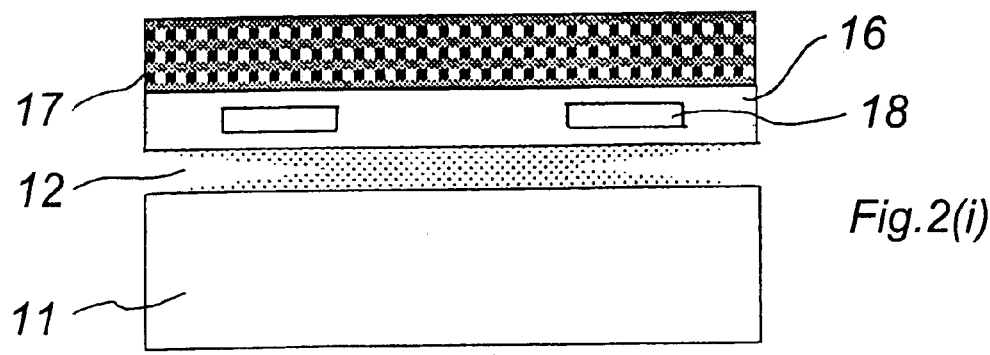

Then, nickel as a catalyst is deposited on the a-Si film 13 to a thickness of 100 to 1000 Å (e.g., 500 Å) by a sputtering method to form a nickel layer 14 (FIG. 1(d)). The adhesion between the a-Si film 13 and the nickel layer 14 can be improved by heating the substrate at 100 to 500° C., preferably 180 to 250° C., during the formation of the nickel layer 14, thereby ensuring formation of a high quality semiconductor layer through the subsequent catalytic reaction. Nickel silicide may be employed instead of nickel.

Thereafter, the resulting substrate is heated at 450 to 580° C. for 1 to 10 minutes. Thus, the catalytic reaction of the a-Si film 13 occurs in the presence of the nickel layer 14, whereby a thin crystalline Si layer 15 is formed in the interface between the a-Si film 13 and the nickel layer 14. At this time, the nickel layer 14 is preferably preliminarily patterned as shown in FIG. 1(d). The thickness of the crystalline Si layer can be controlled (or the crystallization rate can be controlled) by adjusting the area of contact between the nickel layer 14 and the a-Si film 13 by the patterning. This is because the deposited nickel is heat-treated to be turned into nickel silicide, and a portion of the a-Si film in which nickel atoms penetrate is crystallized into Si crystals. The patterning makes it possible to grow Si crystals laterally, whereby high quality crystalline Si can be provided. The thickness of the thin crystalline Si layer 15 depends on the reaction temperature and the reaction period. Where the reaction temperature is 550° C. and the reaction period is 10 minutes, the crystalline Si layer 15 thus formed has a thickness of about 300 Å.

Then, the resulting substrate is annealed in an annealing oven at 450 to 580° C. for eight hours (e.g., in a nitrogen atmosphere at 550° C.). In this step, the entire a-Si film is crystallized into a crystalline Si layer 16 (FIGS. 2(f) and 2(g)). With a thickness of 25 $\mu$m to 100 $\mu$m (e.g., 50 $\mu$m), the crystalline Si layer 16 exhibits flexibility.

In turn, nickel and nickel silicide resulting from a reaction of Si with nickel are etched away with 5 to 30% hydrochloric acid. The etching does not affect the crystalline Si resulting from the catalytic reaction of the a-Si film in the presence of nickel (nickel silicide) (FIG. 2(g)).

Subsequently, semiconductor elements 18 are formed in the crystalline Si layer 16. Thereafter, a flexible second substrate 17 (a stainless film resistant to hydrofluoric acid) is bonded onto a surface of the crystalline Si layer 16 (FIG. 2(h)). The second substrate 17 serves to support the semiconductor layer in the subsequent etching step.

Then, the resulting substrate having the second substrate 17 bonded to the crystalline Si layer 16 is dipped in a hydrofluoric acid solution for etching away the Si oxide film 12, whereby the crystalline Si layer 16 is separated from the underlying substrate 11. Alternatively, the Si oxide film 12 may be removed by cleavage thereof, or polished away together with the underlying substrate 11. Thus, the semiconductor device can be provided, which includes the flexible semiconductor layer and the flexible substrate (FIG. 2(i)). Where a plurality of semiconductor elements 18 are formed in the crystalline Si layer 16, the semiconductor elements 18 are isolated on a per-element basis, as required, by dicing.

Figure 3:
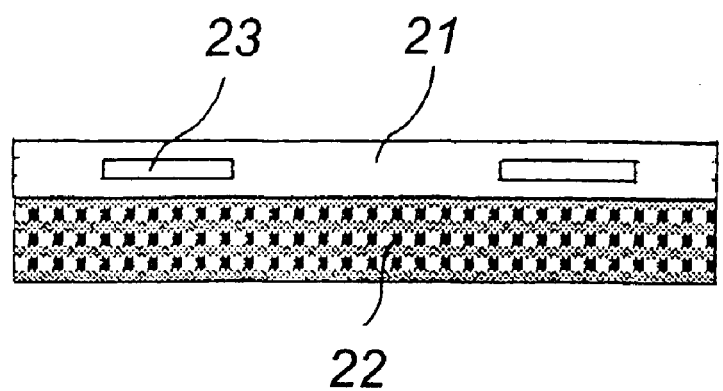
FIG. 3 is a sectional view illustrating the construction of a semiconductor device produced by the semiconductor device production method according to the first embodiment.
Figure 4A:
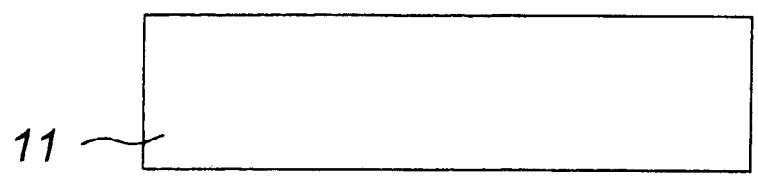
FIGS. 4(a) to 4(d) are diagrams for explaining production steps of a semiconductor device production method according to a second embodiment of the present invention.
Figure 4B:
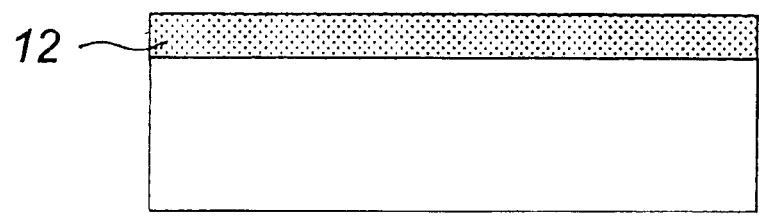
Figure 4C:
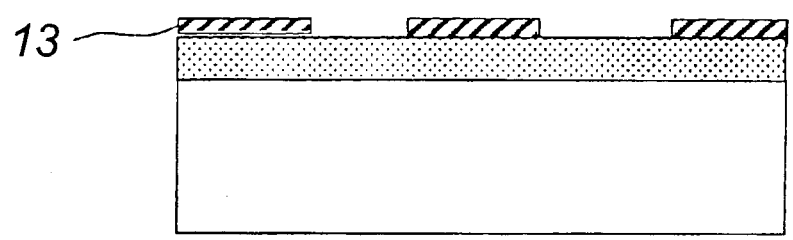
Figure 4D:
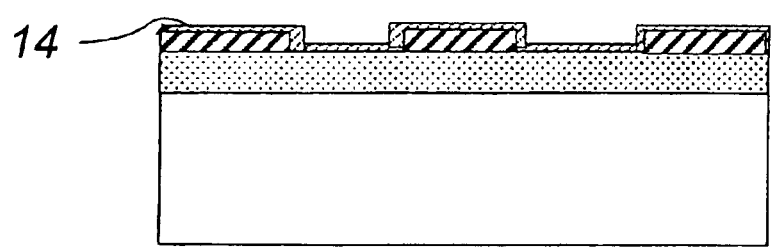

FIG. 3 is a sectional view illustrating the construction of a semiconductor device formed by the aforesaid production method. The semiconductor device according to the present invention includes a semiconductor layer 21, a flexible substrate 22 and semiconductor elements 23.

The semiconductor layer 21 is a crystalline Si layer. Since the semiconductor layer 21 is formed by a process such that the underlying substrate exerts no influence on the surface of the semiconductor layer 21, the morphology of the underlying substrate does not appear on the surface of the underlying substrate. With a thickness of 25 $\mu$m to 100 $\mu$m, the semiconductor layer 21 exhibits flexibility.

The type of the semiconductor elements 23 is not particularly limited, as long as the elements can be formed in the crystalline Si layer. The semiconductor elements 23 are, for example, MOS transistors. For provision of a high breakdown voltage element, the thickness of the crystalline Si layer may be increased as long as the flexibility of the crystalline Si layer is not impaired.

The flexible substrate 22 is a stainless film, which has been used as the second substrate 17 in the aforesaid production process.

Second Embodiment

Next, a second embodiment of the present invention will be described with reference to FIGS. 4(a) to 4(d) and FIGS. 5(e) to 5(h). Although the semiconductor elements are isolated by the dicing after the fabrication of the semiconductor device in the first embodiment, the elements are isolated at the early stage of the semiconductor device production process according to the second embodiment.

FIGS. 4(a) to 4(d) and FIGS. 5(e) to 5(h) are diagrams for explaining production steps of the semiconductor device production method according to the second embodiment of the present invention. A monocrystalline Si substrate is employed as an underlying substrate 11 for the production of a semiconductor device. First, a p-type Si underlying substrate 11 having an impurity concentration of about $5 \times 10^{15}$ cm$^{-3}$ is prepared (a so-called epitaxial substrate having a p-type or n-type epitaxial Si layer grown to a thickness of about 1 μm on a surface of an n-type Si substrate or a p-type Si substrate, or a glass substrate may be prepared) (FIG. 4(a)). An underlying Si oxide (SiO$_2$) film 12 having a thickness of 2000 Å is formed on the underlying substrate 11 by a plasma CVD method (FIG. 4(b)).

In turn, an a-Si film 13 having a thickness of 500 to 3000 Å (e.g., 1500 Å) is formed on the Si oxide film 12 by a plasma CVD method, and heated at 430° C. in a nitrogen atmosphere for 0.1 to 2 hours (e.g., 0.5 hour) for removing hydrogen from the a-Si film 13. Then, the a-Si film 13 is patterned by the photolithography technique for element isolation. Thus, the a-Si film 13 is segmented (FIG. 4(c)).

Then, nickel as a catalyst is deposited to a thickness of 100 to 1000 Å (e.g., 500 Å) on the surface of the substrate having the patterned a-Si film 13 by a sputtering method to form a nickel layer 14 (FIG. 1(d)). The adhesion between the a-Si film 13 and the nickel layer 14 can be improved by heating the substrate at 100 to 500° C., preferably 180 to 250° C., during the formation of the nickel layer 14, thereby ensuring formation of a high quality semiconductor layer through the subsequent catalytic reaction. Nickel silicide may be employed instead of nickel.

Thereafter, the resulting substrate is heated at 450 to 580° C. for 1 to 10 minutes. Thus, the catalytic reaction of the a-Si film 13 occurs in the presence of the nickel layer 14, whereby a thin crystalline Si layer 15 is formed in the interface between the a-Si film 13 and the nickel layer 14 (FIG. 5(e)). The thickness of the thin crystalline Si layer 15 depends on the reaction temperature and the reaction period. Where the reaction temperature is 550° C. and the reaction period is 10 minutes, the crystalline Si layer 15 thus formed has a thickness of about 300 Å. Since the a-Si film 13 is already segmented, the thin crystalline Si film 15 grows in a segmented configuration.

Then, the resulting substrate is annealed in an annealing oven at 450 to 580° C. (e.g., in a nitrogen atmosphere at 550° C.) for eight hours. In this step, the entire a-Si film is crystallized laterally. Thus, a preliminarily segmented crystalline Si layer 16 is provided (FIGS. 5(e) and 5(f)). With a thickness of 25 μm to 100 μm (e.g., 50 μm), the crystalline Si layer 16 exhibits flexibility. In turn, nickel and nickel silicide resulting from a reaction of Si with nickel are etched away with 5 to 30% hydrochloric acid. The etching does not affect the crystalline Si resulting from the catalytic reaction of the a-Si film in the presence of nickel (nickel silicide) (FIG. 5(f)).

Subsequently, semiconductor elements 18 are respectively formed in the crystalline Si layer segments 16.

Figure 5E:
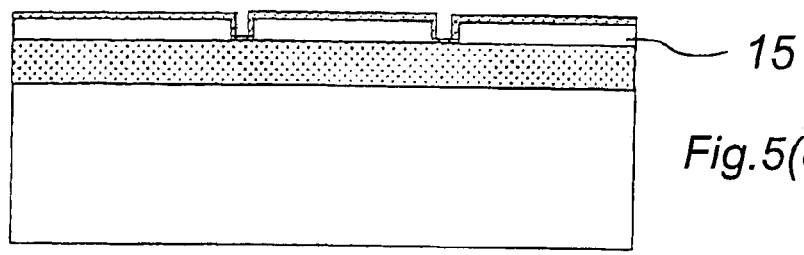
FIGS. 5(e) to 5(h) are diagrams for explaining production steps-of the semiconductor device production method according to the second embodiment.
Figure 5F:
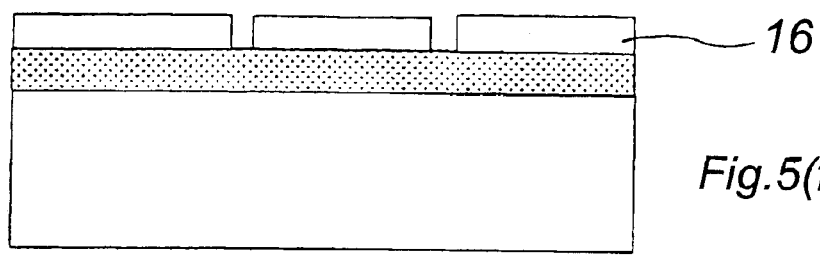
Figure 5G:
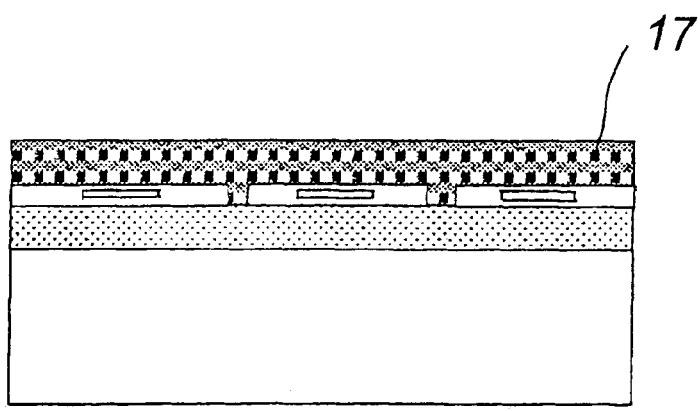
Figure 5H:
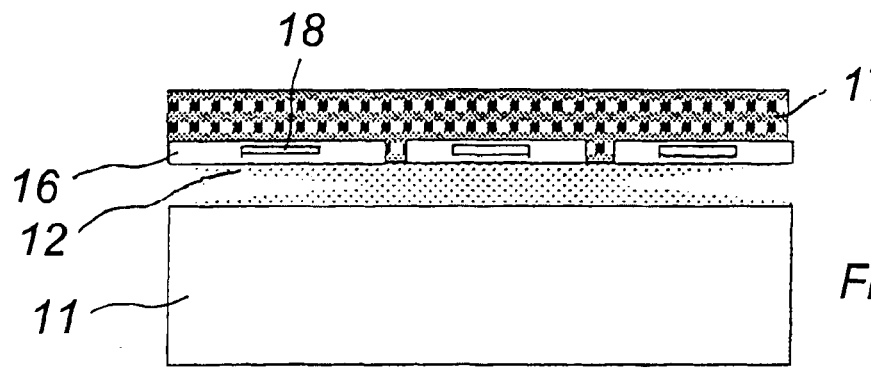

Thereafter, a flexible second substrate 17 (a stainless film resistant to hydrofluoric acid) is bonded onto the surface of the crystalline Si layer 16 (FIG. 5(g)). The second substrate 17 serves to support the semiconductor layer in the subsequent etching step.

Then, the resulting substrate having the second substrate 17 bonded to the crystalline Si layer 16 is dipped in a hydrofluoric acid solution for etching away the Si oxide film 12, whereby the crystalline Si layer 16 is separated from the underlying substrate 11. Alternatively, the Si oxide film 12 may be removed by cleavage thereof. Thus, the semiconductor device can be provided, which includes the flexible semiconductor layer 16 and the flexible second substrate 17 (FIG. 5(h)). According to this method, the semiconductor elements of the semiconductor device thus provided are isolated from each other. Since the semiconductor layer segments 16 formed on the flexible second substrate 17 are completely isolated from each other on a per-element basis, the semiconductor device is highly flexible.

As required, the second substrate 17 may be diced in this state.

Third Embodiment

Next, a third embodiment of the present invention will be described with reference to FIGS. 6(a) to 6(f) and 7(g) to 7(l). FIGS. 6(a) to 6(f) and 7(g) to 7(l) are diagrams for explaining production steps of a semiconductor device production method according to the third embodiment of the present invention.

A monocrystalline Si substrate is employed as an underlying substrate 11 for the production of a semiconductor device. First, a p-type Si underlying substrate 11 having an impurity concentration of about $5 \times 10^{15}$ cm$^{-3}$ is prepared (a so-called epitaxial substrate having a p-type or n-type epitaxial Si layer grown to a thickness of about 1 μm on an n-type Si substrate or a p-type Si substrate, or a glass substrate may be prepared) (FIG. 6(a)). An underlying Si oxide film (SiO$_2$) 12 having a thickness of 2000 Å is formed on the underlying substrate 11 by a plasma CVD method (FIG. 6(b)).

Figure 6A:
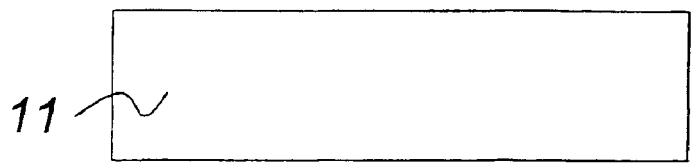
FIGS. 6(a) to 6(f) are diagrams for explaining production steps of a semiconductor device production method according to a third embodiment of the present invention.
Figure 6B:
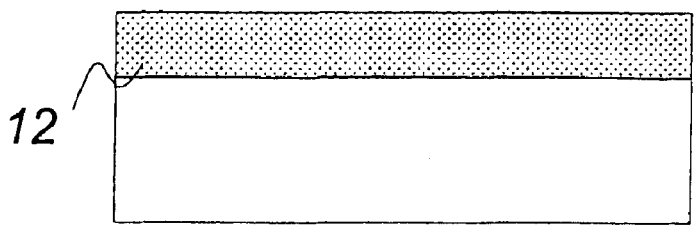
Figure 6C:
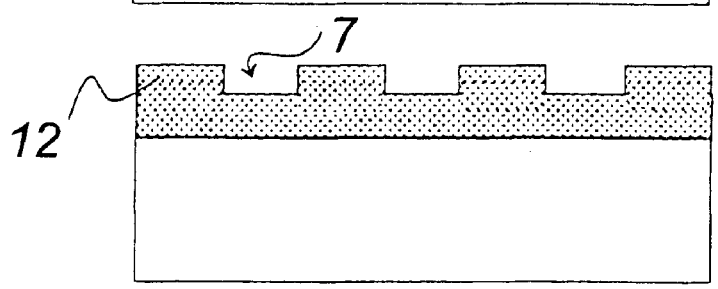
Figure 6D:
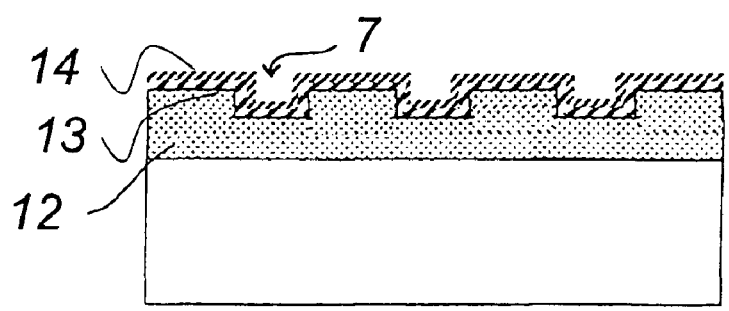

Then, a resist pattern is formed on the Si oxide film 12 by the photolithography technique, and the Si oxide film 12 is partly etched to a depth of about 1000 Å so as to be formed with recesses 7 (FIG. 6(c)).

After the resist is removed from the Si oxide film 12, an a-Si film 13 having a thickness of 500 to 3000 Å (e.g., 500 Å) is formed on the Si oxide film 12 stepped with a level difference by a plasma CVD method, and heated at 430° C. in a nitrogen atmosphere for 0.1 to 2 hours (e.g., 0.5 hour) for removing hydrogen from the a-Si film 13. Then, a nickel layer 14 having a thickness of 100 to 1000 Å (e.g., 500 Å) is formed as a catalytic layer on the resulting substrate by a sputtering method (FIG. 6(d)). The adhesion between the a-Si film 13 and the nickel layer 14 can be improved by heating the substrate at 100 to 500° C., preferably 180 to 250° C., during the formation of the nickel layer 14, thereby ensuring formation of a high quality semiconductor layer through the subsequent catalytic reaction. Nickel silicide may be employed instead of nickel.

Figure 6E:
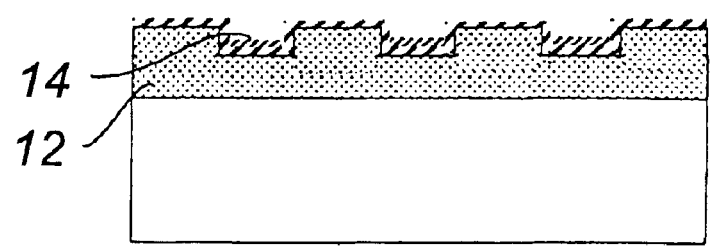
Figure 6F:
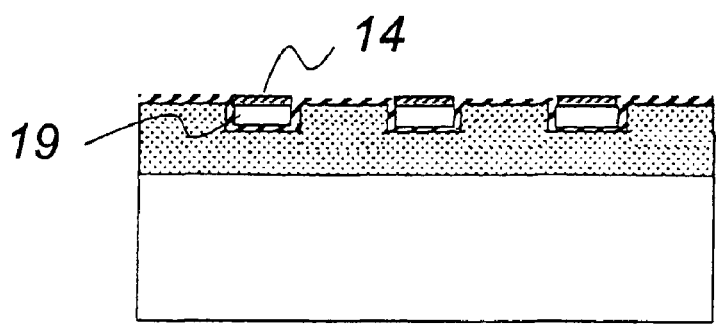

Then, the nickel layer 14 on the a-Si film 13 is patterned so that the nickel layer 14 is partly left in the recesses 7 (FIG. 6(e)).

Thereafter, the resulting substrate is heated at 450 to 580° C. in a nitrogen atmosphere for 1 to 10 minutes. Thus, the catalytic reaction of the a-Si film 13 occurs in the presence of the nickel layer 14, whereby a thin crystalline Si layer 19 is formed in the interface between the a-Si film 13 and the nickel layer 14. The thickness of the thin crystalline Si layer 19 depends on the reaction temperature and the reaction period. Where the reaction temperature is 550° C. and the reaction period is 10 minutes, for example, the crystalline Si layer 19 thus formed has a thickness of about 300 Å (FIG. 6(f)).

Then, the resulting substrate is annealed in an annealing oven at 450 to 580° C. for eight hours (e.g., in a nitrogen atmosphere at 550° C.). Thus, the entire a-Si film is crystallized into a crystalline Si layer 20 (FIG. 7(g)).

Figure 7G:
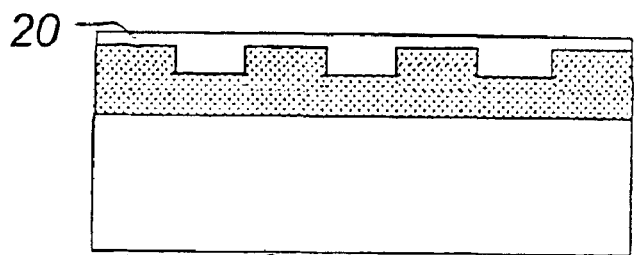
FIGS. 7(g) to 7(l) are diagrams for explaining production steps of the semiconductor device production method according to the third embodiment.
Figure 7H:
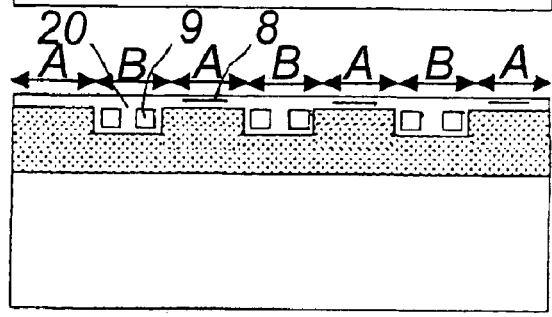

A reason why the crystalline Si layer 20 has a flat surface as shown in FIG. 7(g) is that nickel islands are laterally grown into a nickel silicide film. The laterally grown crystalline Si layer 20 has a high quality with a greater grain size. Therefore, where an element is to be formed only in a thin film portion formed by the lateral crystal growth, the semiconductor device can be produced by utilizing the semiconductor layer having a particularly high quality.

In turn, nickel and nickel silicide resulting from a reaction of Si with nickel are etched away by 5 to 30% hydrochloric acid. The etching does not affect the crystalline Si resulting from the catalytic reaction of the a-Si film in the presence of nickel (nickel silicide) (FIG. 7(g)). Finally, thin film portions A each have a thickness of about 25 μm to about 50 μm, while thick film portions B each have a thickness of about 100 μm.

Subsequently, semiconductor elements are formed in the thin film portions A and the thick film portions B of the crystalline Si layer 20. Where a liquid crystal driver circuit for driving a liquid crystal panel is formed in the crystalline Si film 20, for example, logic circuit portions 8 each constituted only by elements such as a shift resistor operative at a low voltage are formed in the thin film portions A, and driver circuit portions 9 each including high breakdown voltage elements such as a DA converter and an output circuit operative at a high voltage are formed in the thick film portions B from the viewpoint of the breakdown voltage (FIG. 7(h)).

Figure 7I:
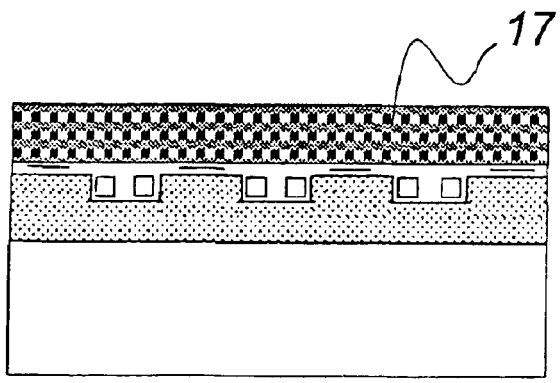
Figure 7J:
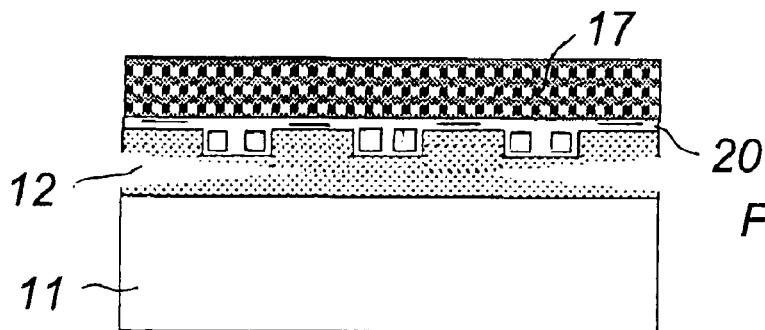

Then, a stainless film resistant to hydrofluoric acid is bonded as a second substrate 17 onto the surface of the crystalline Si layer 20 with the use of an adhesive (FIG. 7(i)). The second substrate 17 serves to support the semiconductor layer in the subsequent etching step. In this embodiment, the second substrate 17 is not necessarily required to have flexibility unlike the first and second embodiments, because a flexible substrate separate from the second substrate 17 is attached to the crystalline Si layer 20 in the subsequent step.

Thereafter, the resulting substrate having the second substrate 17 bonded to the crystalline Si layer 20 is dipped in a hydrofluoric acid solution for etching away the Si oxide film 12, whereby the crystalline Si layer 20 is separated from the underlying substrate 11. Alternatively, the Si oxide film 12 may be removed by cleavage thereof, or polished away together with the underlying substrate 11 (FIG. 7(j)).

Figure 7K:
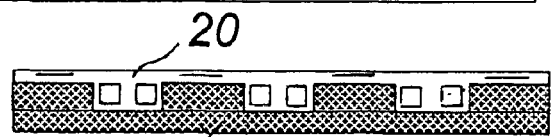
Figure 7L:
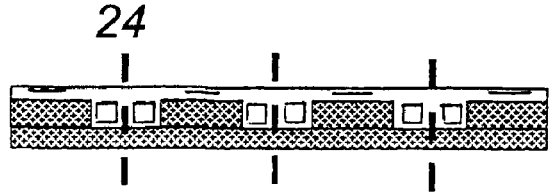

Then, a resin 24 (e.g., a polyimide resin film or a polyester resin film) is applied onto a rear surface of the crystalline Si layer 20 (an undulated surface of the crystalline Si layer 20 which has been opposed to the underlying substrate) as filling recesses (FIG. 7(k)). The resin 24 may be a fluid resin, which is spread on the rear surface of the crystalline Si layer 20 and solidified to be bonded to the crystalline Si layer 20. Alternatively, a flexible, film substrate may be bonded onto the rear surface of the crystalline Si layer 20 with an adhesive. Subsequently, the second substrate 17 is separated from the crystalline Si layer 20. Thus, the flexible semiconductor device is provided (FIG. 7(k)). Thereafter, the elements may be isolated from each other, as required, by dicing (FIG. 7(l)).

According to a modification of the third embodiment, an SOI substrate may be employed. That is, the production method may comprise the step of introducing oxygen into a portion of an Si layer of the SOI substrate adjacent to the interface between the Si layer and an insulative layer and then annealing the resulting substrate, for example, at 1350° C. in a nitrogen atmosphere for four hours. Thus, an undulated insulative layer constituted by the intrinsic insulative layer of the SOI substrate and the Si oxide layer resulting from the introduction of oxygen is formed in the SOI substrate, and the Si layer having the thin film portions and the thick film portions is formed on the undulated insulative layer. However, the production method employing the catalyst is more preferred in view of the ease of the separation step.

Figure 8A:
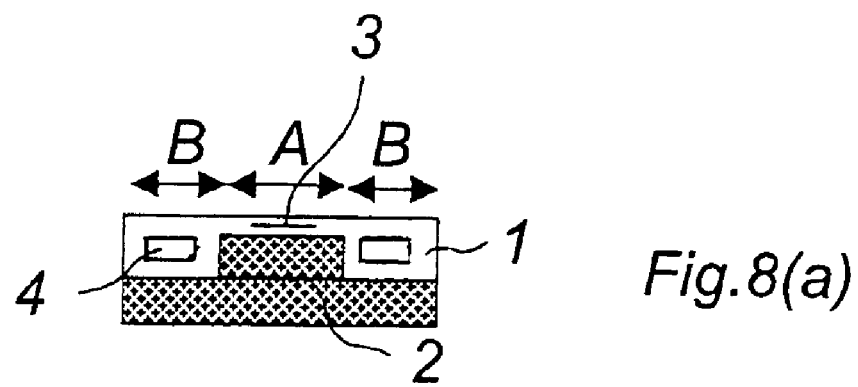
FIGS. 8(a) and 8(b) are sectional-views of a semiconductor device produced by the semiconductor device production method according to the third embodiment.
Figure 8B:
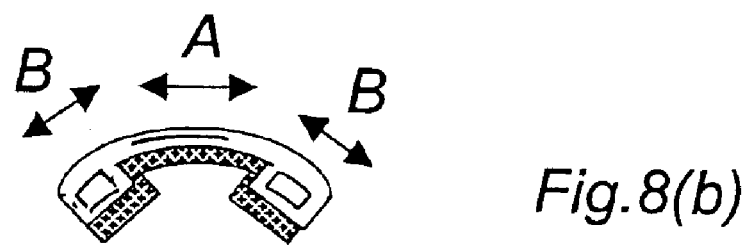
Figure 9A:
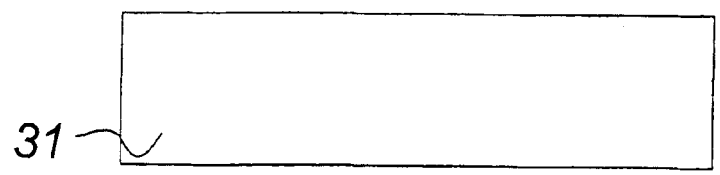
FIGS. 9(a) to 9(f) are diagrams for explaining production steps of a semiconductor device production method according to the prior art.
Figure 9B:
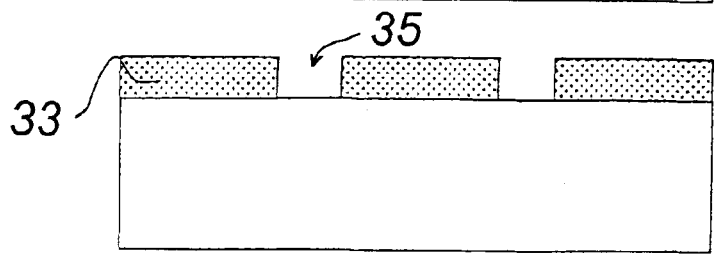
Figure 9C:
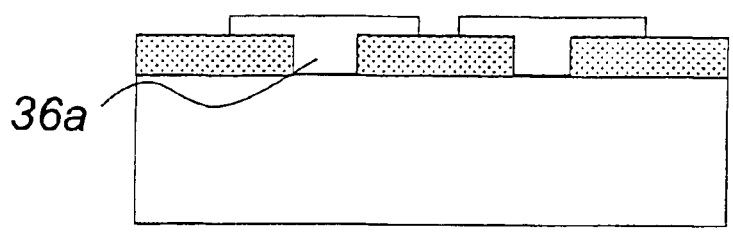
Figure 9D:
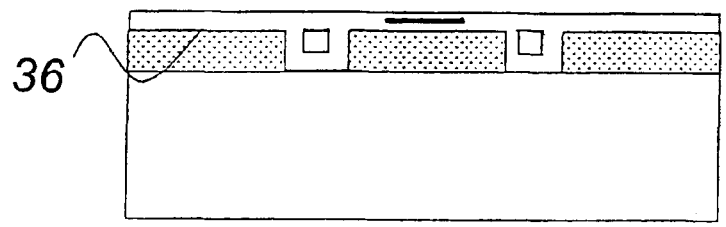
Figure 9E:
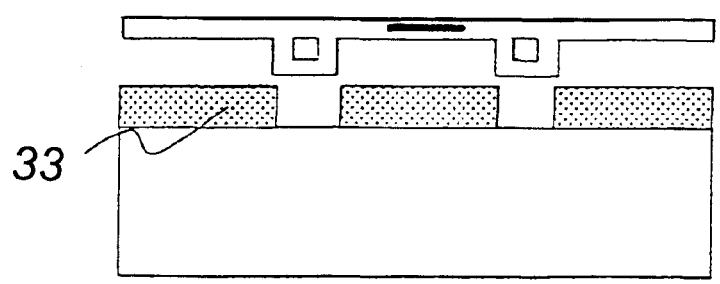
Figure 9F:
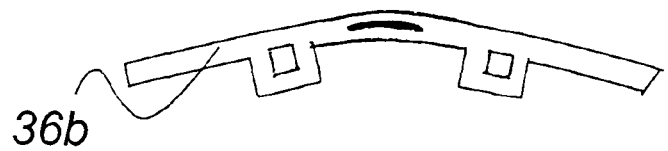

FIGS. 8(a) and 8(b) are diagrams illustrating the construction of a semiconductor device produced by the production method according to the third embodiment. Particularly, FIG. 8(a) is a sectional view illustrating a state of the semiconductor device under application of no stress, and FIG. 8(b) is a sectional view illustrating a state of the semiconductor device under application of a stress. The semiconductor device includes a semiconductor layer 1, a flexible substrate 2, and semiconductor elements 3 and 4.

The semiconductor layer 1 is a crystalline Si layer having a thin film portion A and thick film portions B. The flexible substrate 2 is a resin substrate (e.g., a polyimide resin film or a polyester resin film) bonded to the semiconductor layer 1 to support the thin film portion A and the thick film portions B.

The semiconductor element 3 is formed in the thin film portion A, while the semiconductor elements 4 are respectively formed in the thick film portions B. Thus, the semiconductor elements can be formed in the thin film portion A and the thick film portions B. In the case of a liquid crystal driver, for example, a logic circuit having no high breakdown voltage element is formed in the thin film portion A, and a driver circuit having TFT transistors (high breakdown voltage elements) are formed in the thick film portions B for increasing the breakdown voltage.

The thin film portion A has a thickness of 25 μm to 50 μm to impart sufficient flexibility to the semiconductor device. The thick film portions B each have a thickness of about 100 μm in consideration of a thickness balance with respect to the thin film portion A.

In this semiconductor device, the thick film portions B are provided on the opposite sides of the thin film portion A as shown in FIGS. 8(a) and 8(b), so that the middle thin film portion A contributes to the flexibility of the semiconductor device. However, the configuration of the semiconductor device is not limited thereto. For example, thin film portions A may be provided on the opposite sides of a thick film portion B. Alternatively, two or more thin film portions A and two or more thick film portions B may alternately be arranged in adjacent relation to impart flexibility to a semiconductor device having a greater surface area.

Where the flexible semiconductor device thus produced is mounted on a plastic liquid crystal panel, for example, the flexibility of the semiconductor device permits the liquid crystal panel to stably operate even under a certain stress.

According to the present invention, the flexible semiconductor device can be produced by a simple method. In addition, the semiconductor layer is formed without direct contact with the underlying substrate. Therefore, the substrate to be employed can freely be selected, and the semiconductor device can be produced with no influence of the underlying substrate.

Where the crystalline Si semiconductor layer to be formed with the semiconductor element is formed through the catalytic reaction of the a-Si film in the presence of the catalyst, the selective Si growth can be achieved by controlling the catalytic layer formation region. Therefore, the thickness of the crystalline Si layer can be controlled to ensure optimum film thickness conditions for the production of the semiconductor device.

Where the semiconductor layer has the thick film portion and the thin film portion, a logic circuit portion can be provided in the thin film portion and a driver circuit portion having a high breakdown voltage transistor can be provided in the thick film portion. Thus, the flexible semiconductor device can be produced as having a smaller area.

What is claimed is:

1. A semiconductor device production method comprising:
   (a) forming an insulative film on an underlying substrate;
   (b) forming a semiconductor layer on the insulative film;
   (c) bonding a flexible substrate onto the semiconductor layer; and
   (d) separating the semiconductor layer on the flexible substrate from the insulative film on the underlying substrate; and
   wherein the semiconductor layer has a thickness of 25 $\mu$m to 100 $\mu$m.

2. A semiconductor device production method as set forth in claim 1, wherein the semiconductor layer formed in the step (b) is a crystalline Si layer, wherein the step (b) comprises the steps of:
   (b1) forming an a-Si layer on the insulative film;
   (b2) forming a catalytic layer on the a-Si layer;
   (b3) crystallizing the a-Si layer in contact with the catalytic layer into the crystalline Si layer through a catalytic reaction; and
   (b4) removing the catalytic layer.

3. A semiconductor device production method as set forth in claim 1, further comprising the step of forming a semiconductor element in the semiconductor layer after the step (b).

4. A semiconductor device production method as set forth in claim 1, wherein the insulative film is cleaved or etched away for the separation in the step (d).

5. A semiconductor device as set forth in claim 1, wherein the semiconductor layer is a crystalline Si layer.

6. A semiconductor device production method comprising:
   (a) forming an insulative film on an underlying substrate;
   (b) forming a semiconductor layer on the insulative film;
   (c) bonding a flexible substrate onto the semiconductor layer; and
   (d) separating the semiconductor layer on the flexible substrate from the insulative film on the underlying substrate,
   wherein the semiconductor layer formed in the step (b) is a crystalline Si layer,
   wherein the step (b) comprises the steps of:
   (b1) forming an a-Si layer on the insulative film;
   (b2) forming a catalytic layer on the a-Si layer;
   (b3) crystallizing the a-Si layer in contact with the catalytic layer into the crystalline Si layer through a catalytic reaction; and
   (b4) removing the catalytic layer
   wherein the step (b1) comprises the step of patterning the a-Si film to segment the a-Si film after the formation of the a-Si film.

7. A semiconductor device produced by a semiconductor device production method as recited in claim 6, wherein the semiconductor layer has a thickness of 25 $\mu$m to 100 $\mu$m.

8. A semiconductor device production method comprising:
   (a) forming an insulative film on an underlying substrate;
   (b) forming a semiconductor layer on the insulative film;
   (c) bonding a flexible substrate onto the semiconductor layer; and
   (d) separating the semiconductor layer on the flexible substrate from the insulative film on the underlying substrate,
   wherein the semiconductor layer formed in the step (b) is a crystalline Si layer,
   wherein the step (b) comprises the steps of:
   (b1) forming an a-Si layer on the insulative film;
   (b2) forming a catalytic layer on the a-Si layer;
   (b3) crystallizing the a-Si layer in contact with the catalytic layer into the crystalline Si layer through a catalytic reaction; and
   (b4) removing the catalytic layer
   wherein the step (b2) comprises the step of patterning the catalytic layer after the formation of the catalytic layer.

9. A semiconductor device production method comprising:
   (e) forming an insulative film on an underlying substrate and patterning the insulative film to form a recess in the insulative film;
   (f) forming a semiconductor layer on the insulative film, the semiconductor layer having a thick film portion located on a portion of the insulative film formed with the recess and a thin film portion located on a portion of the insulative film adjacent to the recess;
   (g) separating the underlying substrate from the semiconductor layer; and
   (h) bonding a flexible substrate to the semiconductor layer in place of the separated underlying substrate.

10. A semiconductor device production method as set forth in claim 9, wherein the semiconductor layer formed in the step (f) is a crystalline Si layer, wherein the step (f) comprises the steps of:
    (f1) forming an a-Si layer on the insulative film;
    (f2) forming a catalytic layer on the a-Si layer;
    (f3) patterning the catalytic layer so as to leave a portion of the catalytic layer on the a-Si layer in the recess;
    (f4) crystallizing the a-Si layer in contact with the catalytic layer into the crystalline Si layer through a catalytic reaction; and
    (f5) removing the catalytic layer.

11. A semiconductor device production method as set forth in claim 9, further comprising the step of forming a semiconductor element in at least one of the thick film portion and the thin film portion after the step (f).

12. A semiconductor device production method as set forth in claim 9, further comprising the step of forming a circuit having a high breakdown voltage element in the thick film portion and forming a circuit having no high breakdown voltage element in the thin film portion after the step (f).

13. A semiconductor device production method as set forth in claim 9, wherein the insulative film is cleaved or etched away for the separation in the step (g).

14. A semiconductor device produced by a semiconductor device production method as recited in claim 9, wherein the semiconductor layer has a thickness of 25 $\mu$m to 50 $\mu$m.

15. A semiconductor device as set forth in claim 14, wherein the semiconductor layer is a crystalline Si layer.

* * * * *